United States Patent Office 3,346,499

Patented Oct. 10, 1967

3,346,499

LEAD ZIRCONATE-TITANATE-STANNATE PIEZOELECTRIC CERAMIC CONTAINING THORIUM AND IRIDIUM

Tsuneo Akashi and Masao Takahashi, Shikokumachi, Fumio Yamauchi, Shiba Mita, Norio Tsubouchi, Minatoku, and Tomeji Ohno, Tokyo, Japan, assignors to Nippon Electric Co. Ltd., Tokyo, Japan No Drawing. Filed Mar. 6, 1967, Ser. No. 620,620

Claims priority, application Japan, Mar. 12, 1963, 38/12,951

3 Claims. (Cl. 252—62.9)

ABSTRACT OF THE DISCLOSURE

A piezoelectric ceramic composition having a solid solution of lead zirconate-titanate-stannate as the base and additional constituents of small quantities of thorium oxide and iridium oxide. The ceramic composition has a greatly enhanced electromechanical coupling factor and a high mechanical quality factor, as well.

This application is a continuation-in-part of application Ser. No. 349,322 filed Mar. 4, 1964, and now abandoned.

The present invention relates to piezoelectric ceramic compositions and, more particularly, to a novel piezoelectric ceramic material comprised of lead titanate-zirconate-stannate in which certain additional constituents are added to greatly enhance the electromechanic coupling factor and the high mechanical quality factor of the composition.

As is well known, lead titanate-zirconate-stannate piezoelectric materials, which are solid solutions composed of lead-titanate $PbTiO_3$, lead-zirconate $PbZrO_3$ and $PbSnO_3$, exhibit superior piezoelectric characteristics in comparison with other oxide ferroelectric substances, such as barium titanate.

The fundamental parameters for evaluating the piezoelectric properties of a piezoelectric material are the electromechanical coupling factor and the mechanical quality factor. The former is an indication of the efficiency of transforming the electric oscillation into mechanical vibration and conversely, of transforming the mechanical vibration into electric oscillation. Thus, the higher the electromechanical coupling factor, the better the efficiency of conversion.

The mechanical quality factor is in the inverse proportion to energy consumed by the composition during the energy conversion. Larger mechanical quality factors indicate smaller energy consumption and vice versa.

One of the areas of application of piezoelectric compositions is the manufacture of ceramic filter elements. In manufacturing such elements, it is necessary to furnish an electromechanical coupling factor with an optimum value selected from a wide range, and it is desirable for mechanical quality factor to be as great as possible. This is described in an article by Macario entitled, "Design Data for Band-Pass Ladder Filters Employing Ceramic Resonator," Electronic Engineering, vol. 33 (1961), No. 3, pages 171–177.

In transducer elements of mechanical filters, it is necessary that both the electromechanical coupling factor and the mechanical quality factor be as large as possible.

It is therefore one object of the instant invention to provide ferroelectric ceramic materials having large electromechanical coupling factors as well as large mechanical quality factors.

Still another object of the instant invention is to provide a novel piezoelectric material of lead titanate-zirconate-stannate compositions which contain additional constituents of thorium oxide and iridium oxide which are added to enhance both the electromechanical coupling factor and the mechanical quality factor.

Still another obpect of the instant invention is to provide a novel piezoelectric material having a lead titanate-zirconate-stannate composition wherein a portion of the lead is substituted for by barium, strontium, or calcium.

These and other objects of the instant invention will become more apparent when reading the accompanying specification.

The compositions of this invention contain a solid solution of lead-zirconate, lead-titanate, and lead-stannate, which may be represented by $Pb(Zr_xTi_ySn_z)O_3$. Additional constituents of thorium oxide and iridium oxide are provided to enhance the mechanical quality factor and electromechanical coupling factor of the composition. The ranges for $x$, $y$ and $z$ are restricted to $x=0.00$–$0.90$, $y=0.10$–$0.60$, and $z=0.00$–$0.65$, wherein the total of $x$, $y$ and $z$ is equal to 1.00.

Compositions falling outside this range do not have electromechanical coupling factors of sufficient magnitude to provide efficient piezoelectric ceramic elements for transducers of mechanical filters.

The largest electromechanical coupling factor is obtainable in cases where $x$, $y$ and $z$ are in the range of 0.52–0.54, 0.48–0.46 and 0.00, respectively.

The excellent piezoelectric properties available in the materials described above are not diminished even if at least one member of the group consisting of barium (Ba), strontium (Sr), and calcium (Ca) are substituted for up to 26 percent of the lead content of the basic composition.

The amount of thorium oxide present may vary from 0.30 weight percent to 7.0 weight percent, while the amount of iridium oxide may vary from 0.01 weight percent to 0.70 weight percent.

*Example I*

The basic composition represented by the formula $Pb(Zr_{0.54}Ti_{0.46})O_3$ (i.e., $x=0.54$, $y=0.46$, $z=0.00$) was prepared by mixing a powder consisting of 50 mol percent lead monoxide (PbO), 27 mol percent zirconium dioxide ($ZrO_2$) and 23 mol percent titanium dioxide ($TiO_2$). Varying amounts of thorium dioxide and iridium dioxide were added to the mixture. The amount of thorium dioxide never exceeded 7.0 percent while the addition of iridium dioxide never exceeded 0.70 percent. Some samples contain no thorium dioxide. Other samples contain no iridium dioxide; while still other samples prepared contain varying mixtures of thorium and iridium oxides. All the constituents were mixed in a ball mill, and the mixed powder was presintered at 900° C. for one hour, crushed, press-molded into discs, and sintered at 1300° C. for an hour. The resulting ceramic discs were provided with silver electrodes, and were piezoelectrically activated at 100° C. for an hour by means of an electric field of 50 kv./cm. After standing for 24 hours the electromechanical coupling factor $k_r$ for the radial mode vibration and the mechanical quality factor $Q_m$ were measured. The results obtained are shown in Table 1.

TABLE 1

| No. | Composition | $k_r$ (Percent) | $Q_m$ |
|---|---|---|---|
| 1 | $Pb(Zr_{0.54}Ti_{0.46})O_3$ | 48 | 300 |
| 2 | $Pb(Zr_{0.54}Ti_{0.46})O_3$ plus 0.30 wt. percent $ThO_2$ | 52 | 105 |
| 3 | $Pb(Zr_{0.54}Ti_{0.46})O_3$ plus 0.50 wt. percent $ThO_2$ | 58 | 90 |
| 4 | $Pb(Zr_{0.54}Ti_{0.46})O_3$ plus 0.70 wt. percent $ThO_2$ | 62 | 90 |
| 5 | $Pb(Zr_{0.54}Ti_{0.46})O_3$ plus 1.0 wt. percent $ThO_2$ | 61 | 90 |
| 6 | $Pb(Zr_{0.54}Ti_{0.46})O_3$ plus 2.0 wt. percent $ThO_2$ | 60 | 90 |
| 7 | $Pb(Zr_{0.54}Ti_{0.46})O_3$ plus 3.0 wt. percent $ThO_2$ | 59 | 90 |
| 8 | $Pb(Zr_{0.54}Ti_{0.46})O_3$ plus 5.0 wt. percent $ThO_2$ | 50 | 110 |
| 9 | $Pb(Zr_{0.54}Ti_{0.46})O_3$ plus 7.0 wt. percent $ThO_2$ | 45 | 120 |
| 10 | $Pb(Zr_{0.54}Ti_{0.46})O_3$ plus 0.30 wt. percent $ThO_2$ plus 0.01 wt. percent $IrO_2$ | 59 | 120 |
| 11 | $Pb(Zr_{0.54}Ti_{0.46})O_3$ plus 0.30 wt. percent $ThO_2$ plus 0.02 wt. percent $IrO_2$ | 60 | 110 |
| 12 | $Pb(Zr_{0.54}Ti_{0.46})O_3$ plus 0.30 wt. percent $ThO_2$ plus 0.30 wt. percent $IrO_2$ | 67 | 230 |
| 13 | $Pb(Zr_{0.54}Ti_{0.46})O_3$ plus 0.50 wt. percent $ThO_2$ plus 0.20 wt. percent $IrO_2$ | 61 | 150 |
| 14 | $Pb(Zr_{0.54}Ti_{0.46})O_3$ plus 0.50 wt. percent $ThO_2$ plus 0.30 wt. percent $IrO_2$ | 67 | 250 |
| 15 | $Pb(Zr_{0.54}Ti_{0.46})O_3$ plus 1.0 wt. percent $ThO_2$ plus 0.02 wt. percent $IrO_2$ | 63 | 100 |
| 16 | $Pb(Zr_{0.54}Ti_{0.46})O_3$ plus 1.0 wt. percent $ThO_2$ plus 0.50 wt. percent $IrO_2$ | 65 | 250 |
| 17 | $Pb(Zr_{0.54}Ti_{0.46})O_3$ plus 3.0 wt. percent $ThO_2$ plus 0.30 wt. percent $IrO_2$ | 64 | 240 |
| 18 | $Pb(Zr_{0.56}Ti_{0.46})O_3$ plus 3.0 wt. percent $ThO_2$ plus 0.70 wt. percent $IrO_2$ | 60 | 240 |
| 19 | $Pb(Zr_{0.54}Ti_{0.46})O_3$ plus 5.0 wt. percent $ThO_2$ plus 0.05 wt. percent $IrO_2$ | 52 | 130 |
| 20 | $Pb(Zr_{0.54}Ti_{0.46})O_3$ plus 5.0 wt. percent $ThO_2$ plus 0.10 wt. percent $IrO_2$ | 52 | 160 |
| 21 | $Pb(Zr_{0.54}Ti_{0.46})O_3$ plus 7.0 wt. percent $ThO_2$ plus 0.30 wt. percent $IrO_2$ | 52 | 230 |

The results of Nos. 1–9 show that the incorporation of thorium dioxide by itself into the basic ceramic composition resulted in a marked increase in $k_r$, but a corresponding decrease in $Q_m$.

The results of Nos. 10–21 showed that the addition of iridium dioxide in amounts extending from 0.01 weight percent to 0.70 weight percent in combination with thorium dioxide from 0.30 weight percent to 7.0 weight percent markedly increased $Q_m$, while maintaining $K_r$ at an equivalent, or increased value.

In the event that the content of thorium dioxide exceeds 7.0 weight percent, or is less than 0.30 percent, the improvement in characteristics is not obtained even if amounts of iridium dioxide are added to the mixture. Correspondingly, in the event that the contents of iridium dioxide exceeds 0.70 percent, or if less than 0.01 weight percent, the addition of thorium oxide does little to improve the piezoelectric characteristics of the basic composition.

The improvements made in the piezoelectric properties by the addition of both $ThO_2$ and $IrO_2$ clearly results from the presence of both thorium and iridium ions. Thus, thorium compounds other than thorium dioxide, as, for example, thorium hydroxide [$(Th(OH)_4)$], may be used in the material to provide an amount of thorium ions equivalent to that derived from thorium dioxide. Similarly, iridium compounds [(for example, iridium chloride $(IrCl_3)$], may be used in the materials to provide an amount of iridium ions equal to that provided by iridium dioxide.

However, such thorium and iridium compounds are required to be able to decompose into thorium and iridium oxide, respectively, at elevated temperatures.

In the event that such compounds are used, they should be utilized in amounts equivalent to the desired mol percent proportion obtained when using the oxides.

*Example II*

Lead zirconate-lead titanate basic compositions wherein 0.50, 0.52 and 0.56 were selected for $x$ in a compositional formula $Pb(Zr_xTi_{1-x})O_3$, were prepared by the procedure outlined in Example I. Thorium dioxide in an amount of 0.50 weight percent, and iridium dioxide in the amount of 0.30 weight percent were added to the basic compositions. The discs so prepared were tested for $k_r$ and $Q_m$. The results obtained are shown in Table 2.

TABLE 2

| No. | Composition | $K_r$ (Percent) | $Q_m$ |
|---|---|---|---|
| 22 | $Pb(Zr_{0.50}Ti_{0.50})O_3$ | 29 | 340 |
| 23 | $Pb(Zr_{0.50}Ti_{0.50})O_3$ plus 0.50 wt. percent $ThO_2$ | 42 | 115 |
| 24 | $Pb(Zr_{0.50}Ti_{0.50})O_3$ plus 0.50 wt. percent $ThO_2$ plus 0.30 wt. percent $IrO_2$ | 53 | 480 |
| 25 | $Pb(Zr_{0.52}Ti_{0.48})O_3$ | 45 | 350 |
| 26 | $Pb(Zr_{0.52}Ti_{0.48})O_3$ plus 0.50 wt. percent $ThO_2$ | 56 | 100 |
| 27 | $Pb(Zr_{0.52}Ti_{0.48})O_3$ plus 0.50 wt. percent $ThO_2$ plus 0.30 wt. percent $IrO_2$ | 62 | 320 |
| 28 | $Pb(Zr_{0.56}Ti_{0.44})O_3$ | 43 | 340 |
| 29 | $Pb(Zr_{0.56}Ti_{0.44})O_3$ plus 0.50 wt. percent $ThO_2$ | 55 | 92 |
| 30 | $Pb(Zr_{0.56}Ti_{0.44})O_3$ plus 0.50 wt. percent $ThO_2$ plus 0.30 wt. percent $IrO_2$ | 60 | 360 |

The results shown in Table 2 indicate that regardless of the change in contents of zirconate and titanate in the basic composition, the piezoelectric properties are remarkably improved by the addition of both thorium dioxide and iridium dioxide.

*Example III*

Two lead zirconate-titanate-stannate basic compositions were prepared following the procedure outlined in Example I. The $x$, $y$ and $z$ values for each material were 0.40, 0.46 and 0.05 in Example No. 31, and 0.44, 0.46 and 0.10 for Example No. 34. To samples 32 and 35, 0.50 weight percent of thorium dioxide was added, while to samples 33 and 36, 0.30 weight percent iridium dioxide was combined with 0.50 weight percent thorium dioxide. The results obtained are shown in Table 3.

TABLE 3

| No. | Composition | $K_r$ (Percent) | $Q_m$ |
|---|---|---|---|
| 31 | $Pb(Zr_{0.49}To_{0.46}Sn_{0.05})O_3$ | 46 | 330 |
| 32 | $Pb(Zr_{0.49}Ti_{0.46}Sn_{0.05})O_3$ plus 0.50 wt. percent $ThO_2$ | 58 | 90 |
| 33 | $Pb(Zr_{0.49}Ti_{0.46}Sn_{0.05})O_3$ plus 0.50 wt. percent $ThO_2$ plus 0.30 wt. percent $IrO_2$ | 65 | 300 |
| 34 | $Pb(Zr_{0.44}Ti_{0.45}Sn_{0.10})O_3$ | 45 | 350 |
| 35 | $Pb(Zr_{0.44}Ti_{0.46}Sn_{0.10})O_3$ plus 0.50 wt. percent $ThO_2$ | 56 | 90 |
| 36 | $Pb(Zr_{0.44}Ti_{0.46}Sn_{0.10})O_3$ plus 0.50 wt. percent $ThO_2$ plus 0.30 wt. percent $IrO_2$ | 63 | 270 |

A comparison of the results of sample 14 of Table 1 with the results of Table 3 shows that the substitution of tin for a portion of the lead zirconate-titanate basic composition does not adversely affect the piezoelectric properties which are improved by the addition of both thorium dioxide and iridium dioxide.

*Example IV*

Sintered discs were prepared following the procedure outlined in Example I, except that at least one member of the group consisting of barium, strontium, and calcium were substituted for 2 atom percent of lead in the compositions of 1 and 14 of Table 1 and for 6 atom percent of lead in the compositions of 31 and 33 in Table 3. The results obtained are shown in Table 4.

TABLE 4

| No. | Composition | $K_r$ (Percent) | $Q_m$ |
|---|---|---|---|
| 37 | $Pb_{0.98}Ba_{0.02}(Zr_{0.54}Ti_{0.46})O_3$ | 47 | 270 |
| 38 | $Pb_{0.98}Ba_{0.02}(Zr_{0.54}Ti_{0.46})O_3$ plus 0.50 wt. percent $ThO_2$ plus 0.30 wt. percent $IrO_2$ | 67 | 310 |
| 39 | $Pb_{0.98}Sr_{0.02}(Zr_{0.54}Ti_{0.46})O_3$ | 48 | 280 |
| 40 | $Pb_{0.98}Sr_{0.02}(Zr_{0.54}Ti_{0.46})O_3$ plus 0.50 wt. percent $ThO_2$ plus 0.30 wt. percent $IrO_2$ | 66 | 270 |
| 41 | $Pb_{0.94}Sr_{0.06}(Zr_{0.49}Ti_{0.46}Sn_{0.05})O_3$ | 46 | 320 |
| 42 | $Pb_{0.94}Sr_{0.06}(Zr_{0.49}Ti_{0.46}Sn_{0.05})O_3$ plus 0.50 wt. percent $ThO_2$ plus 0.30 wt. percent $IrO_2$ | 63 | 280 |
| 43 | $Pb_{0.98}Ca_{0.02}(Zr_{0.54}Ti_{0.46})O_3$ | 45 | 320 |
| 44 | $Pb_{0.98}Ca_{0.02}(Zr_{0.54}Ti_{0.46})O_3$ plus 0.50 wt. percent $ThO_2$ plus 0.30 wt. percent $IrO_2$ | 64 | 320 |

The results shown in Table 4 demonstrate that the substitution of barium, strontium or calcium for a portion of the lead in the basic composition does not affect the improved piezoelectric properties obtained by the addition of both thorium dioxide and iridium dioxide to the basic composition.

It should be emphasized again that the addition of either thorium dioxide or iridium dioxide alone does not affect the beneficial results obtained by their joint addition.

The piezoelectric properties referred to are obtained after polarization treatment carried out at temperatures ranging from 50° C.–150° C. Such polarization at elevated temperatures is necessary, as low temperature polarization does not affect the beneficial results which have been illustrated in Tables 1–4.

Although there has been described a preferred embodiment of this novel invention, many variations and modifications will now be apparent to those skilled in the art. Therefore, this invention is to be limited, not by the specific disclosure herein, but only by the appending claims.

The embodiments of the invention in which an exclusive privilege or property is claimed are defined as follows:

1. A piezoelectric ceramic composition having the formula $Pb(Zr_xTi_ySn_z)O_3$, wherein $x=0.00$–$0.90$, $y=0.10$–$0.60$ and $z=0.00$–$0.65$, the sum of $x$, $y$ and $z$ being equal to 1.00; said composition incorporating iridium dioxide and thorium dioxide in amounts of from 0.01 to 0.7 weight percent iridium dioxide, and from 0.30 to 7.0 weight percent thorium dioxide.

2. The composition of claim 1, wherein $x=0.52$–$0.54$, $y=0.48$–$0.46$ and $z=0.00$.

3. The composition of claim 1, wherein up to 25 atom percent of lead (Pb) is substituted for by at least one member of the group consisting of barium, strontium and calcium.

References Cited

UNITED STATES PATENTS 3,264,217 8/1966 Kulcsar ----------- 252—62.9

TOBIAS E. LEVOW, *Primary Examiner.*

R. D. EDMONDS, *Assistant Examiner.*